United States Patent
Zhang et al.

(10) Patent No.: US 8,328,246 B2
(45) Date of Patent: Dec. 11, 2012

(54) ENCLOSURE FOR ELECTRONIC DEVICE

(75) Inventors: Guang-Yi Zhang, Shenzhen (CN); Jia-Qi Fu, Shenzhen (CN); Xu-Fei Liang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 410 days.

(21) Appl. No.: 12/699,054

(22) Filed: Feb. 3, 2010

(65) Prior Publication Data

US 2011/0156549 A1   Jun. 30, 2011

(30) Foreign Application Priority Data

Dec. 24, 2009   (CN) .......................... 2009 1 0312114

(51) Int. Cl.
*E05C 9/00* (2006.01)
*E05C 1/00* (2006.01)

(52) U.S. Cl. ............... 292/32; 292/33; 292/37; 292/42; 292/137; 292/140; 312/223.1

(58) Field of Classification Search ............. 292/32–35, 292/37, 38, 41, 42, 137, 140, 156, 159, 163, 292/169, 174, DIG. 31, DIG. 68; 312/223.1
See application file for complete search history.

(56) References Cited

U.S. PATENT DOCUMENTS

| | | | | |
|---|---|---|---|---|
| 932,330 A * | 8/1909 | Rotchford | ...................... | 70/118 |
| 1,154,235 A * | 9/1915 | Cobb | .............................. | 292/37 |
| 1,174,652 A * | 3/1916 | Banks | ............................... | 292/36 |
| 1,269,572 A * | 6/1918 | Allenbaugh | ..................... | 292/37 |
| 1,556,864 A * | 10/1925 | Mendenhall | ...................... | 292/33 |
| 1,593,435 A * | 7/1926 | Carter | ............................. | 292/36 |
| 1,671,249 A * | 5/1928 | Lieberman | ........................ | 70/118 |
| 2,649,322 A * | 8/1953 | Grant | ............................. | 292/173 |
| 2,913,122 A * | 11/1959 | Lomas | ............................. | 108/17 |
| 3,751,949 A * | 8/1973 | Castle | ............................. | 70/144 |
| 4,470,277 A * | 9/1984 | Uyeda | ............................. | 70/118 |
| 4,547,006 A * | 10/1985 | Castanier | ........................ | 292/37 |
| 4,559,880 A * | 12/1985 | Lacka | ............................. | 109/51 |
| 5,938,248 A * | 8/1999 | Vickers et al. | ................... | 292/36 |
| 6,152,505 A * | 11/2000 | Vickers et al. | ................... | 292/34 |
| 6,217,087 B1 * | 4/2001 | Fuller | ............................. | 292/39 |
| 6,601,884 B2 * | 8/2003 | Bastian | .......................... | 292/222 |
| 6,719,332 B2 * | 4/2004 | Sekulovic | ...................... | 292/170 |
| 7,798,540 B1 * | 9/2010 | Vitry et al. | ...................... | 292/216 |
| 8,033,582 B2 * | 10/2011 | Sawatani et al. | ................. | 292/33 |
| 2006/0207182 A1 * | 9/2006 | Van Parys | ........................ | 49/192 |
| 2006/0291155 A1 * | 12/2006 | Chen et al. | ...................... | 361/683 |

FOREIGN PATENT DOCUMENTS

GB   1349839   *   4/1974

* cited by examiner

*Primary Examiner* — Carlos Lugo
(74) *Attorney, Agent, or Firm* — Altis Law Group, Inc.

(57) ABSTRACT

An enclosure of an electronic device includes a chassis defining an opening, a cover attached to the chassis to shield the opening of the chassis, and a latch apparatus mounted to the cover to lock the cover to the chassis. The latch apparatus includes a driving mechanism, a first latch mechanism, and a second latch mechanism. The first and the second latch mechanisms are connected to the driving mechanisms. The driving mechanism is manipulated to operate the first latch mechanism to engage with a first edge of the chassis, and drive the second latch mechanism to engage with a second edge of the chassis.

13 Claims, 15 Drawing Sheets

ENCLOSURE FOR ELECTRONIC DEVICE

BACKGROUND

1. Technical Field

The present disclosure relates to an enclosure for an electronic device.

2. Description of the Related Art

An electronic component system usually includes an enclosure, to protect a plurality of electronic components received therein, and to shield the electromagnetic radiation generated by electronic components. The enclosure includes a chassis defining an opening in a sidewall, a cover attached to the chassis to shield the opening, and a latch mechanism to lock the cover to the chassis. However, the latch mechanism generally engages with only one point of the chassis, or only one edge of the chassis, therefore, the cover tends to be improperly engaged with the chassis and brings a risk of leakage of electromagnetic radiation.

DETAILED DESCRIPTION

Figure 1:
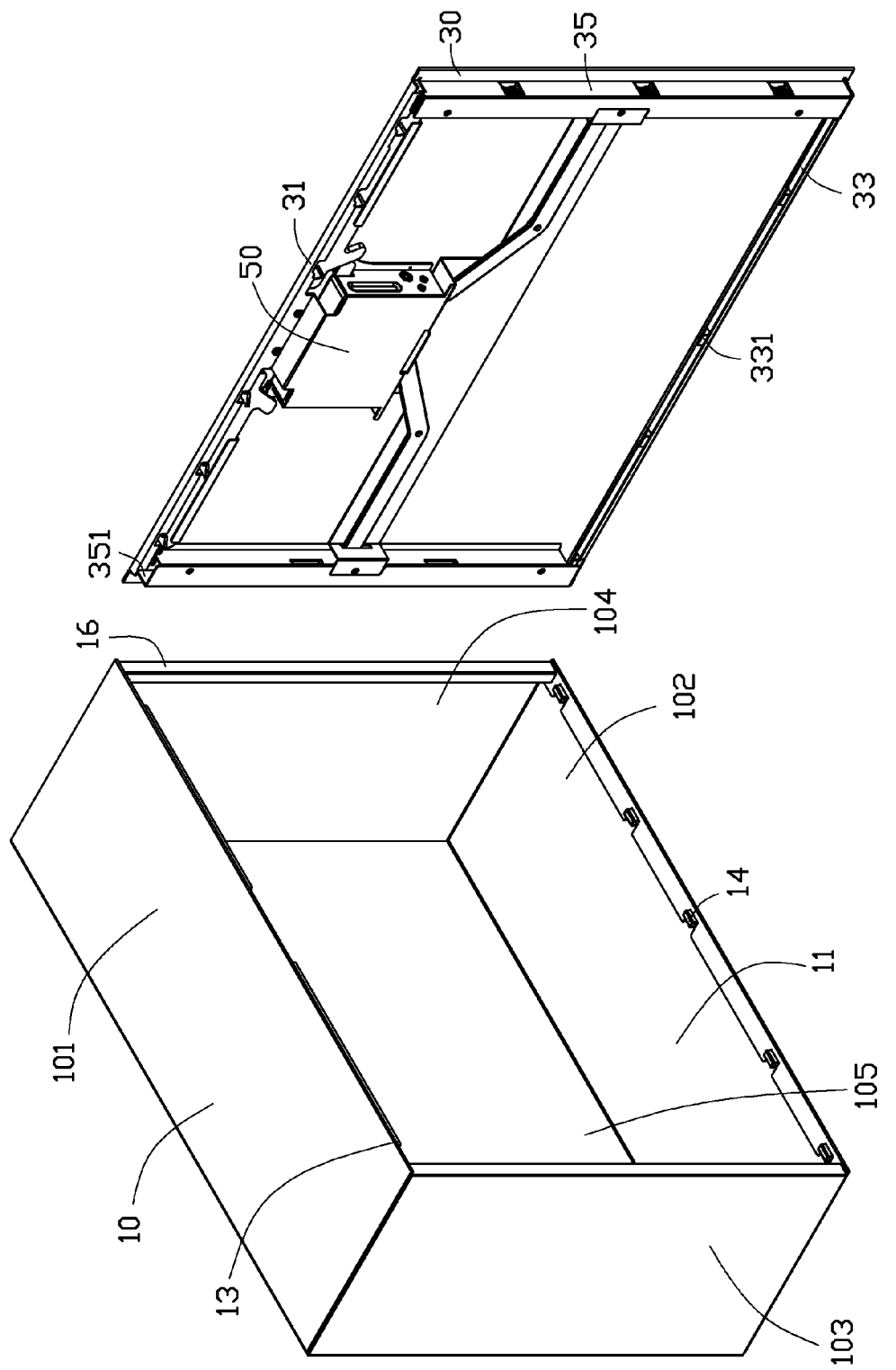
FIG. 1 is an exploded, isometric view of an embodiment of an enclosure, the enclosure including a chassis, a cover, and a latch apparatus.
Figure 2:
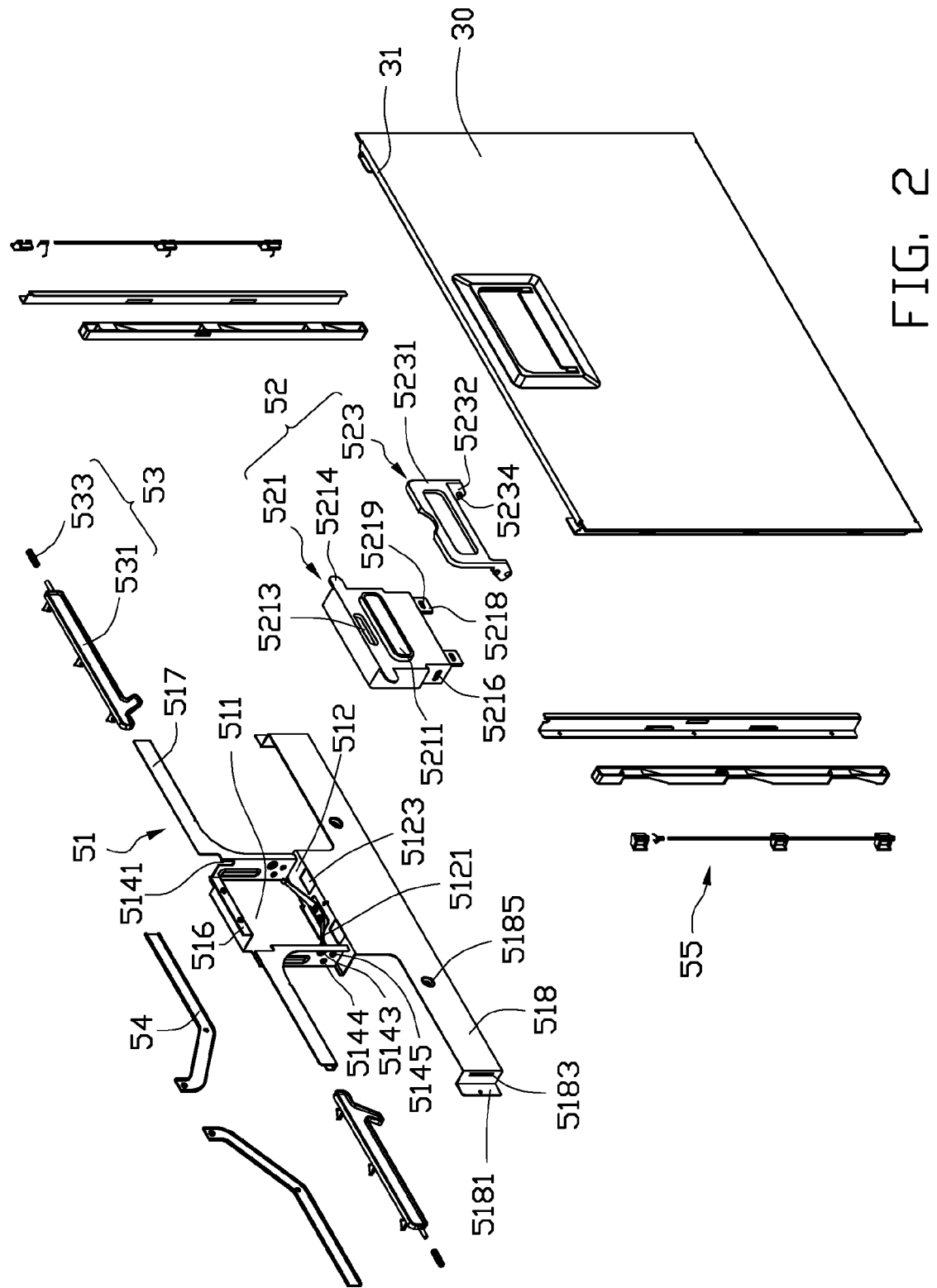
FIGS. 2 and 3 are exploded, isometric views of the cover and the latch apparatus of FIG. 1, viewed from different perspectives, the latch apparatus including two first latch mechanisms and two second latch mechanisms.
Figure 3:
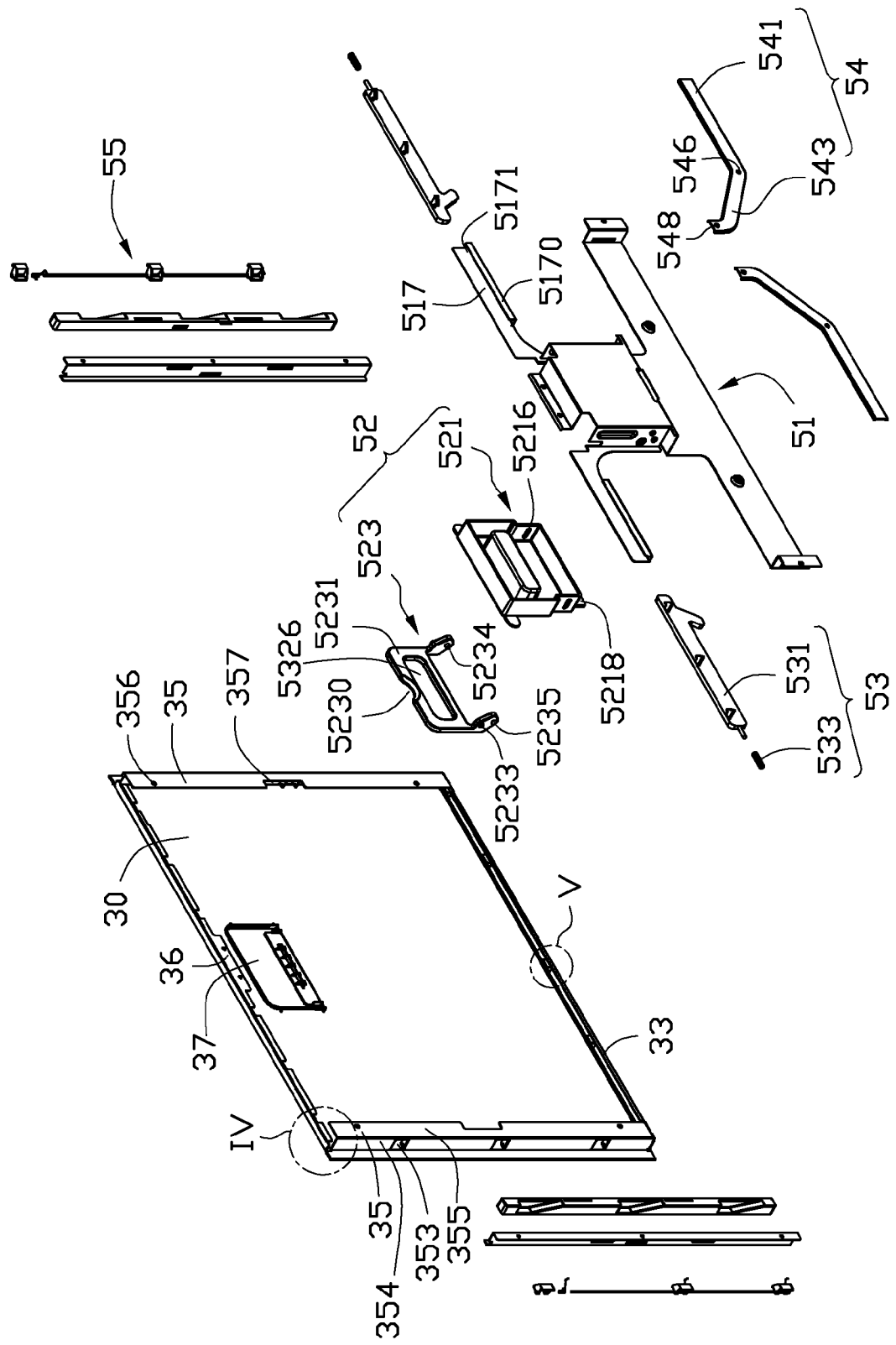
Figure 4:
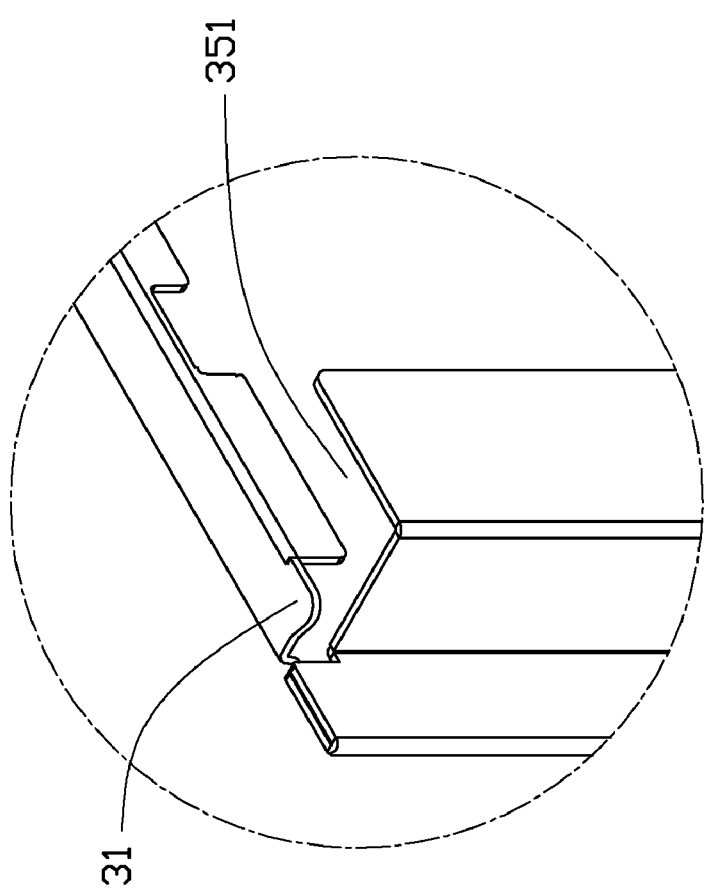
FIG. 4 is an enlarged view of the encircled portion IV of FIG. 3.
Figure 5:
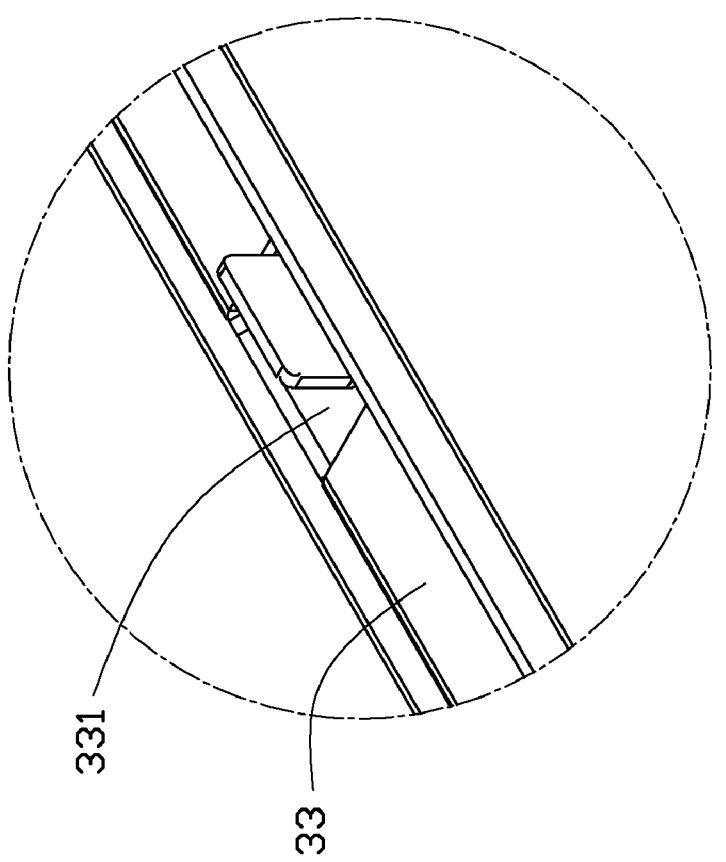
FIG. 5 is an enlarged view of the encircled portion V of FIG. 3.

Referring to FIG. 1, an embodiment of an enclosure of an electronic device, such as a computer, includes a chassis 10, a cover 30, and a latch apparatus 50.

Figure 13:
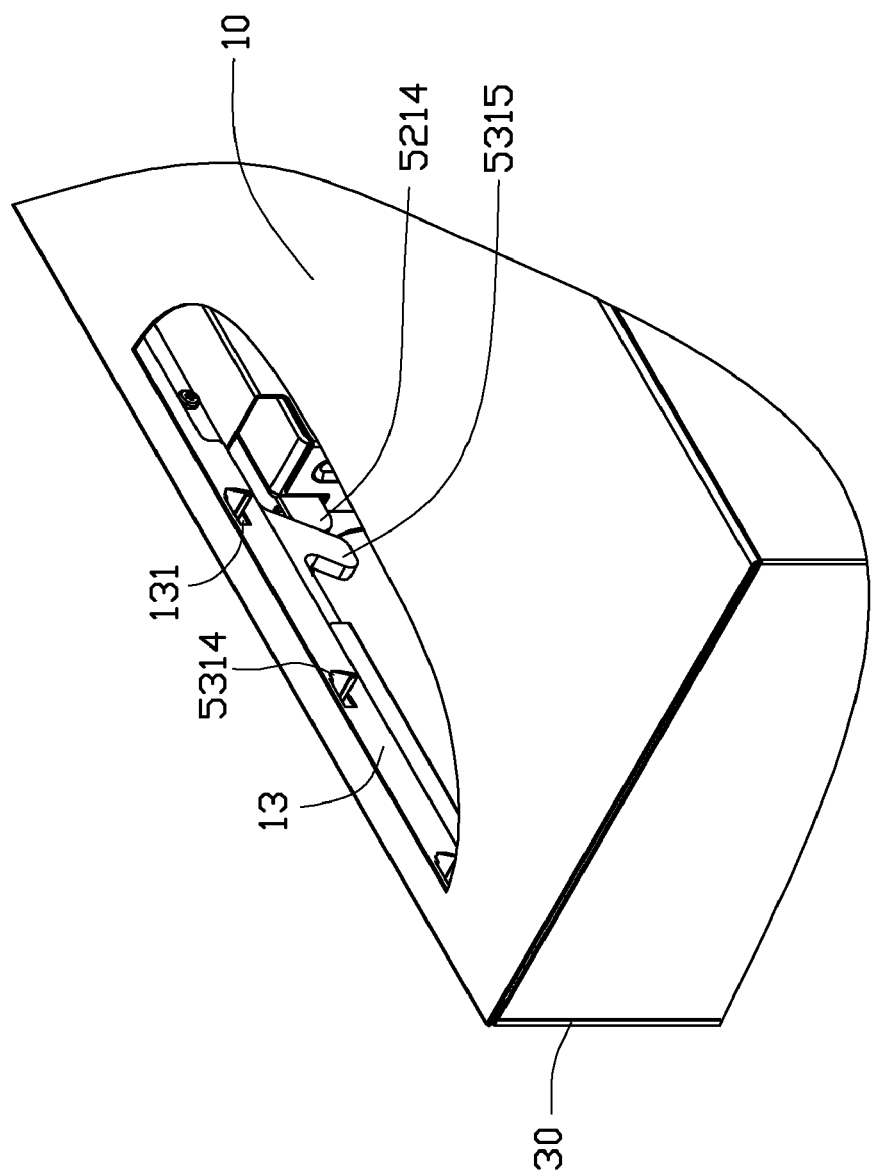
FIG. 13 is a partially enlarged, and cutaway view of FIG. 12.

The chassis 10 is a rectangular box including a top wall 101, a bottom wall 102 opposite to the top wall 101, a front wall 103 perpendicularly connected between front ends of the top and bottom walls 101 and 102, a rear wall 104 opposite to the front wall 103 and perpendicularly connected between rear ends of the top and bottom walls 101 and 102, and a sidewall 105 perpendicularly connected to first sides of the top wall 101, bottom wall 102, and front and rear walls 103 and 104. An opening 11 is bounded by second sides of the top wall 101, bottom wall 102, and front and rear walls 103 and 104, and opposite the sidewall 105. A flange 13 perpendicularly extends downwards from the second side of the top wall 101, towards the bottom wall 102, and a plurality of tabs 14 extends upwards from the second side of the bottom wall 102, towards the top wall 101. The flange 13 defines a plurality of latch holes 131 (shown in FIG. 13). Two curling portions 16 respectively extend from the second sides of the front wall 103 and the rear wall 104, towards the opening 11.

Referring to FIGS. 2-5, the cover 30 forms a top flange 31 and a bottom flange 33 at a top side and a bottom side of the cover 30, respectively. The bottom flange 33 defines a plurality of through holes 331. Two reinforcing bars 35 are attached to an inner surface of the cover 30 and adjacent to opposite ends of the cover 30, correspondingly. Each of the reinforcing bars 35 is angular shape with a first piece 354 perpendicular to the cover 30, and a second piece 355 perpendicular to the first piece 354. Each of the reinforcing bars 35 and the cover 30 collectively bound a receiving space 351. Each of the first pieces 354 defines three positioning holes 353 arranged along a lengthwise direction of the first piece 354. Each of the second pieces 355 defines two fastening holes 356 adjacent to opposite ends of the second piece 355, and a notch 357 between the fastening holes 356. An opening 37 is defined in the cover 30 adjacent to the top side of the cover 30. A fixing piece 36 is formed on the inner surface of the cover 30, at the top side of the cover 30.

The latch apparatus 50 includes a bracket 51, a driving mechanism 52, two first latch mechanisms 53, two drive links 54, and two second latch mechanisms 55.

The bracket 51 is substantially H-shaped, and includes a main body 515, two first supporting arms 517 extending perpendicularly from a top end of the main body 515 along opposite directions, and two second supporting arms 518 extending perpendicularly from a bottom end of the main body 515 along opposite directions. The main body 515 defines a rectangular accommodating space 511, adjacent to the top end of the main body 515. A V-shaped spring piece 5121 is attached to a first sidewall 512 bounding the accommodating space 511 and adjacent to the bottom end of the main body 515. Two through holes 5123 are defined in the first sidewall 512. Each of opposite second sidewalls 514 bound the accommodating space 511 and perpendicularly connect to opposite ends of the first sidewall 512 which defines a guiding slot 5141, a pivot hole 5143, a first positioning hole 5144, and a second positioning hole 5145. The pivot hole 5143 is equidistant from the first positioning hole 5144 and the second positioning hole 5145. A first fixing portion 516 extends from the top end of the main body 515, perpendicularly away from the first sidewall 512. The first fixing portion 516 defines two threaded holes 517. An L-shaped flange 5170 extends from a bottom of each first supporting arm 517, bounding a mounting slot 5171 together with the first supporting arm 517. An L-shaped second fixing portion 5181 extends from a distal end of each second supporting arm 518, and defines an alignment slot 5183 adjacent to the second supporting arm 518. A mounting hole 5185 is defined in the second supporting arm 518, adjacent to the main body 515.

The driving mechanism 52 includes a driving member 521 and a manipulating member 523. The driving member 521 is a rectangular box. An outer surface of a first sidewall 5210 of the driving member 521 defines a first recessed portion 5211 and a second recessed portion 5213 arranged above the first recessed portion 5211. Two tabs 5214 correspondingly extend from two opposite second sidewalls 5212 of the driving member 521 perpendicularly extended from opposite ends of the first sidewall 5210, adjacent to a top of the driving member 521. Two oblong holes 5216 are correspondingly defined in the second sidewalls 5212 of the driving member 521, adjacent to a bottom of the driving member 521. Two coupling pieces 5218 extend from the bottom of the driving member 521. Each of the coupling pieces 5218 defines a coupling hole 5219. The manipulating member 523 includes a ring-shaped handgrip 5231 and two mounting legs 5232 extending from the bottom of the handgrip 5231. The handgrip 5231 defines an opening 5236 in a middle of the handgrip 5231, and a semicircular notch 5230 in the top edge of the handgrip 5231. A pivoting post 5233 and a positioning post 5234 respectively extend from the outside and inside surfaces of each of the mounting legs 5232. A bulge 5235 protrudes from the outside surface of each of the mounting legs 5232, in alignment with the positioning post 5234 of the mounting leg 5232.

Figure 6:
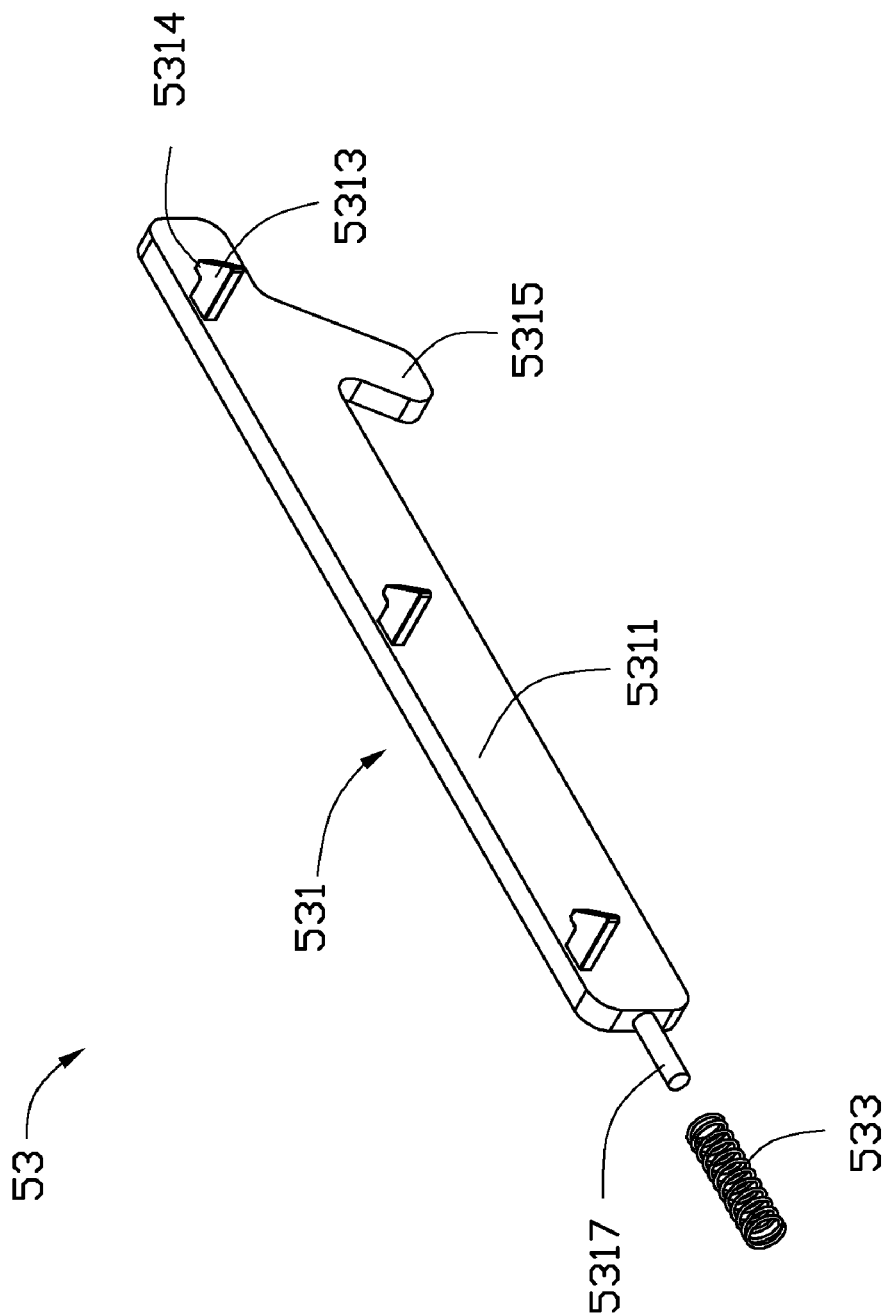
FIG. 6 is an enlarged, exploded view of one of the first latch mechanisms of FIG. 3.

Referring to FIG. 6, each of the first latch mechanisms 53 includes a latching member 531 and a first resilient member 533. The latching member 531 includes a sliding bar 5311, a plurality of latches 5313 perpendicularly extending from the sliding bar 5311, an abutting portion 5315 adjacent to the first end of the sliding bar 5311 and slanting downwards from the bottom of the sliding bar 5311 towards the second end of the sliding bar 5311, and an inserting pole 5317 extending from the second end of the sliding bar 5311. Each of the latches 5313 includes an engagement tooth 5314 slantingly extending from a distal end of the latch 5313 towards the first end of the sliding bar 5311. In one embodiment, the first resilient member 533 is a coil spring.

Referring to FIGS. 2 and 3 again, each of the drive links 54 includes a first linking arm 541 and a second linking arm 543 slantingly extending from a first end of the first linking arm 541. A pivot hole 546 is defined in an conjunction with the first linking arm 541 and the second linking arm 543 of each of the drive links 54. A coupling portion 548 is formed at a distal end of the second linking arm 543 away from the first linking arm 541.

Figure 7:
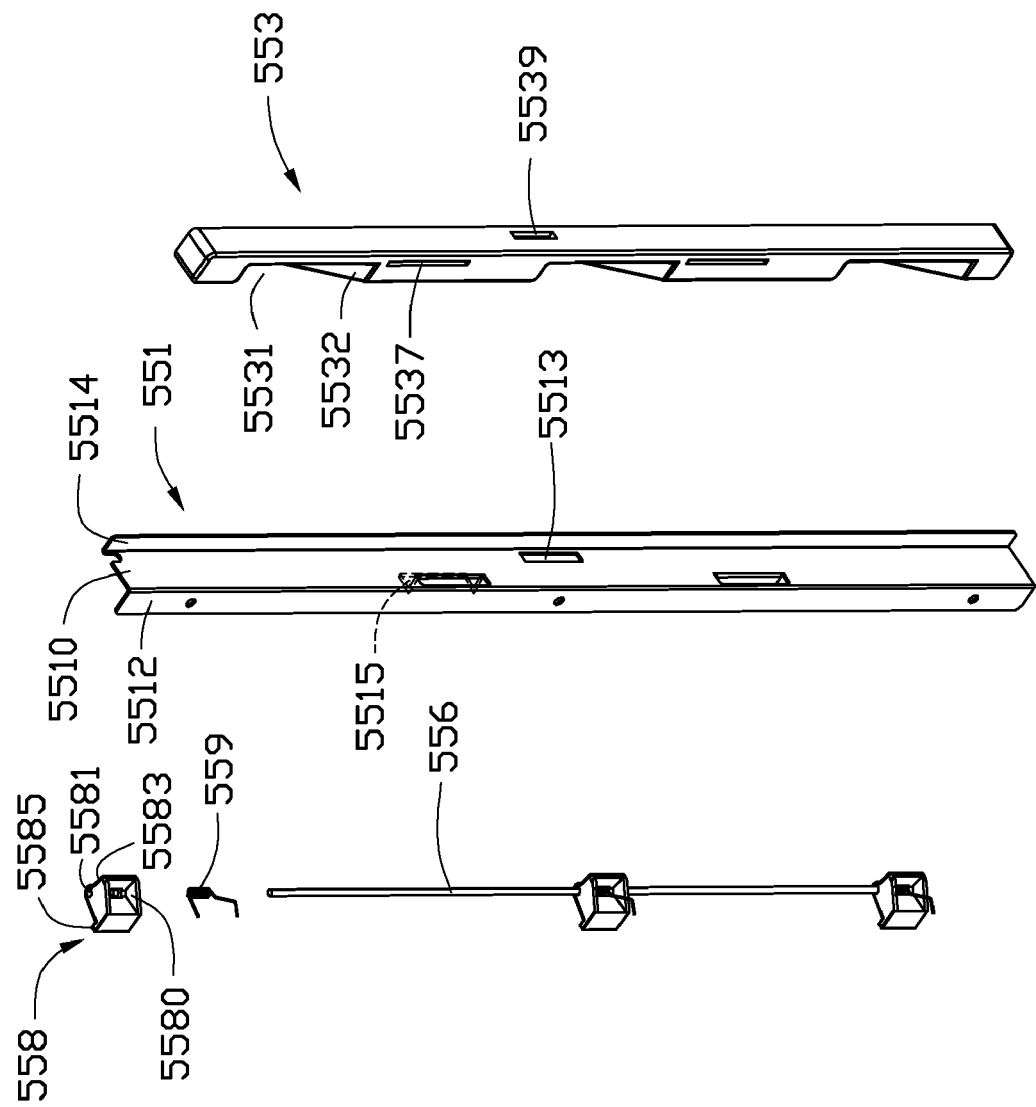
FIG. 7 is an enlarged, exploded view of one of the second latch mechanisms of FIG. 3, but viewed from another perspective.
Figure 8:
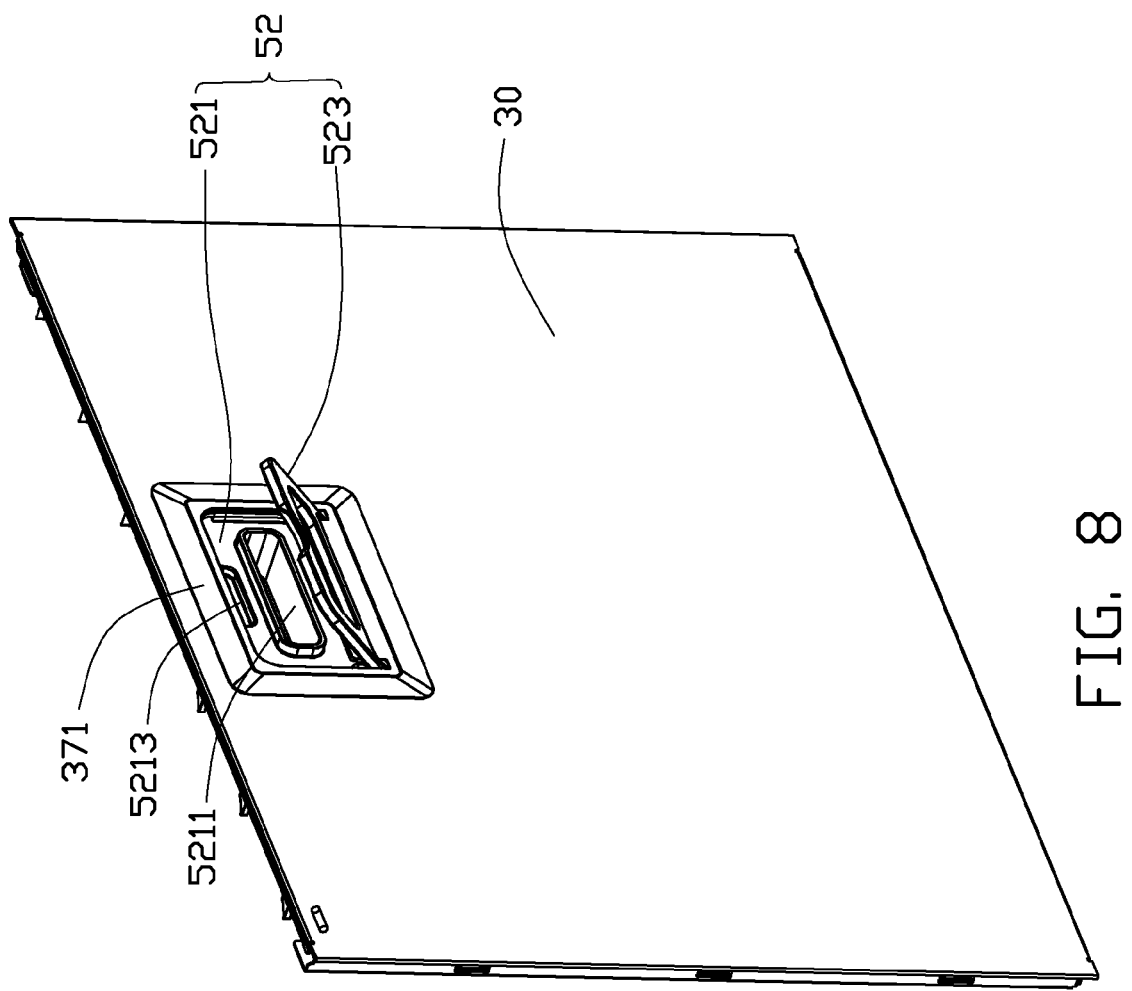
FIG. 8 is an assembled, isometric view of the cover and the latch apparatus of FIG. 2, showing the first latch mechanisms and the second latch mechanisms in unlocked positions.
Figure 9:
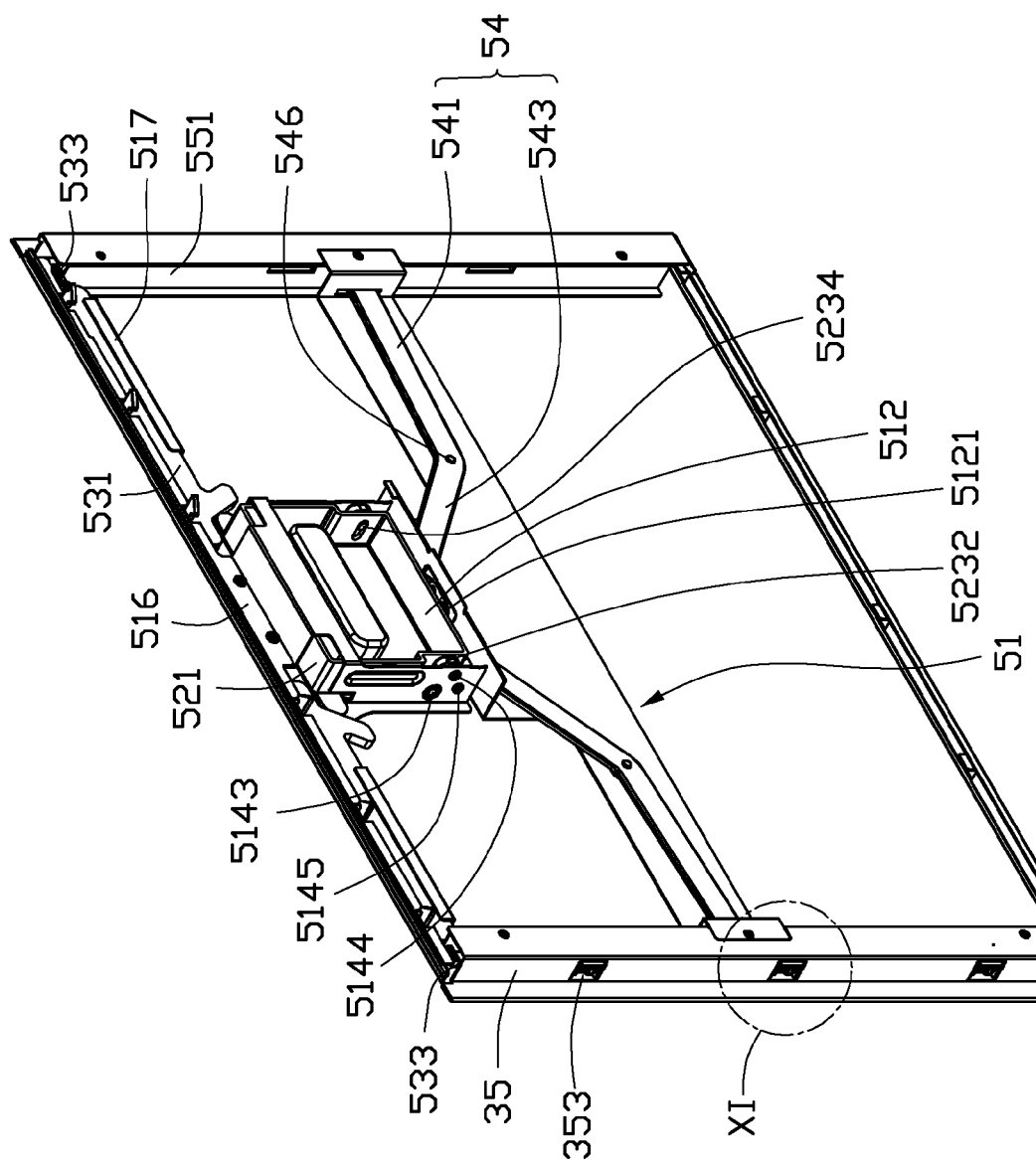
FIGS. 9 and 10 are assembled, isometric views of FIG. 3, but respectively showing the first latch mechanisms and the second latch mechanisms in locked positions, and unlock positions.
Figure 10:
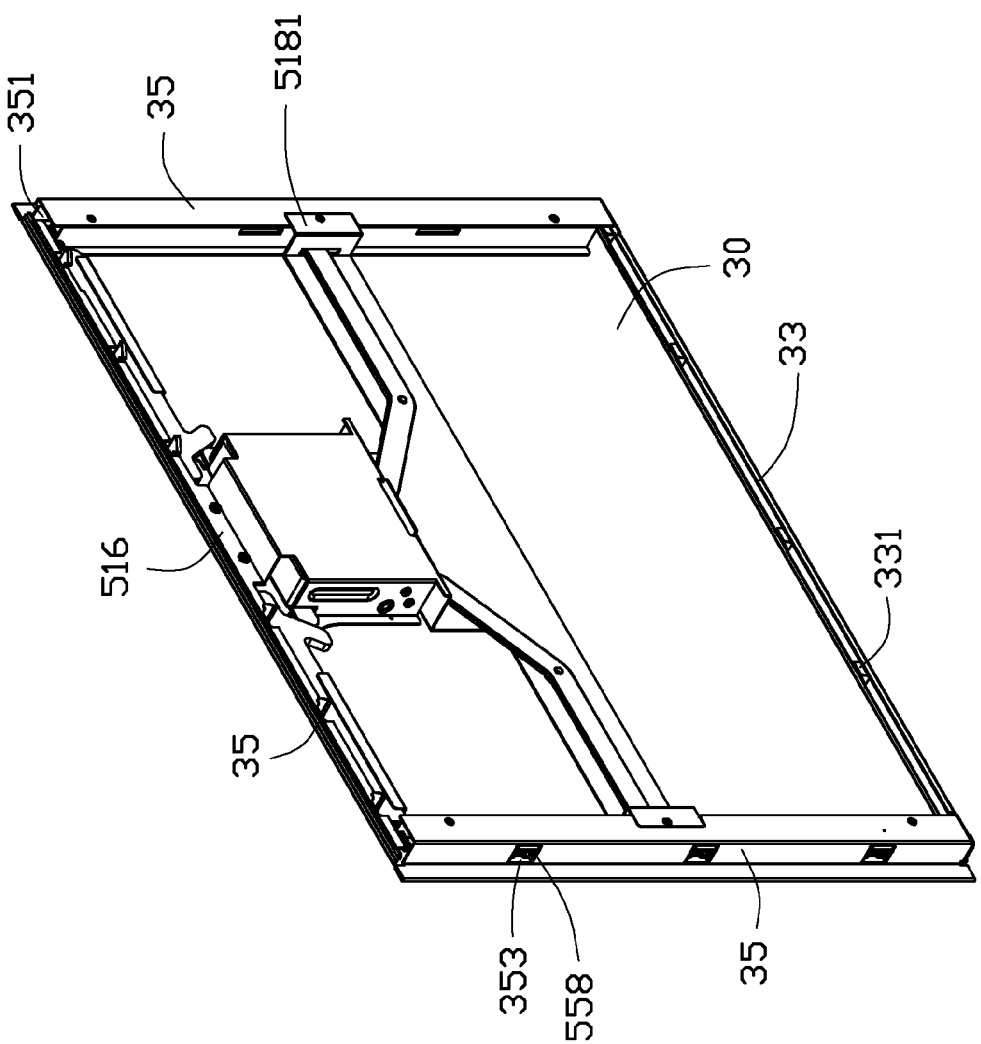
Figure 11:
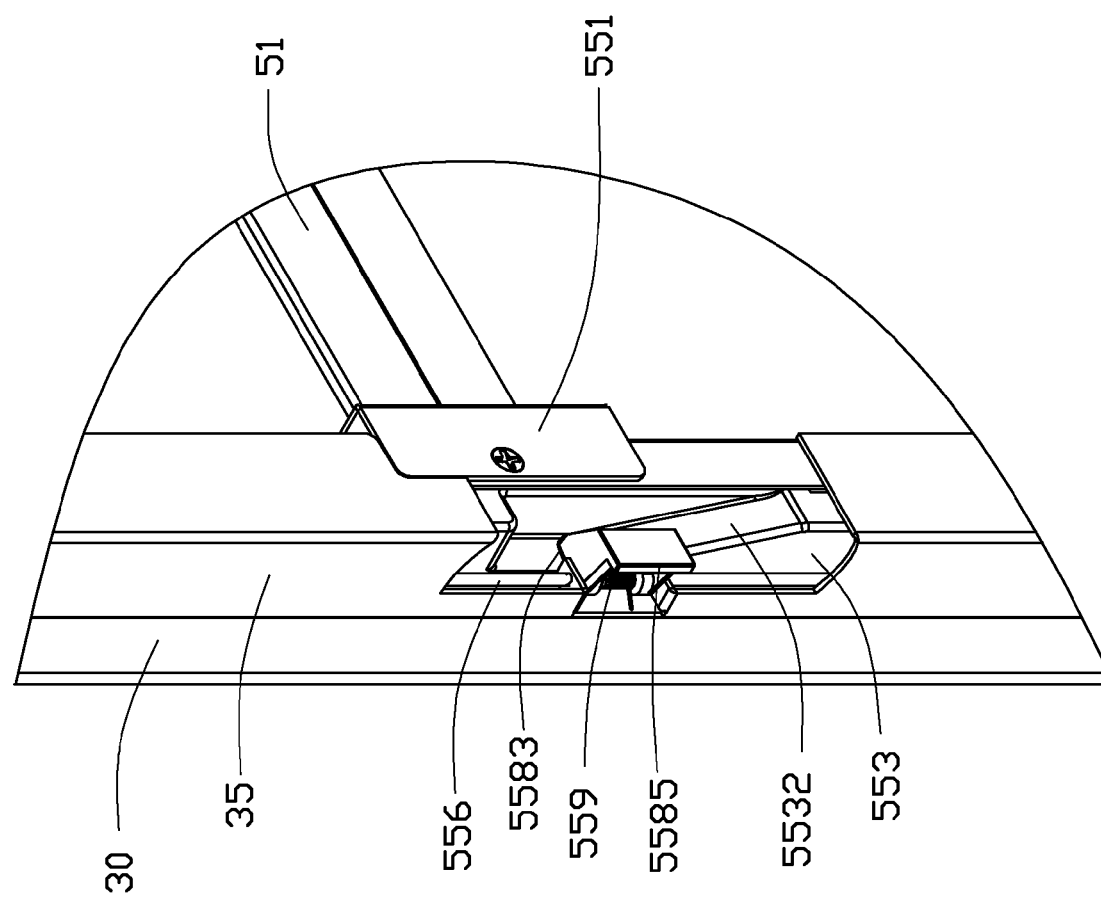
FIG. 11 is an enlarged, cutaway view of the encircled portion XI of FIG. 9.
Figure 12:
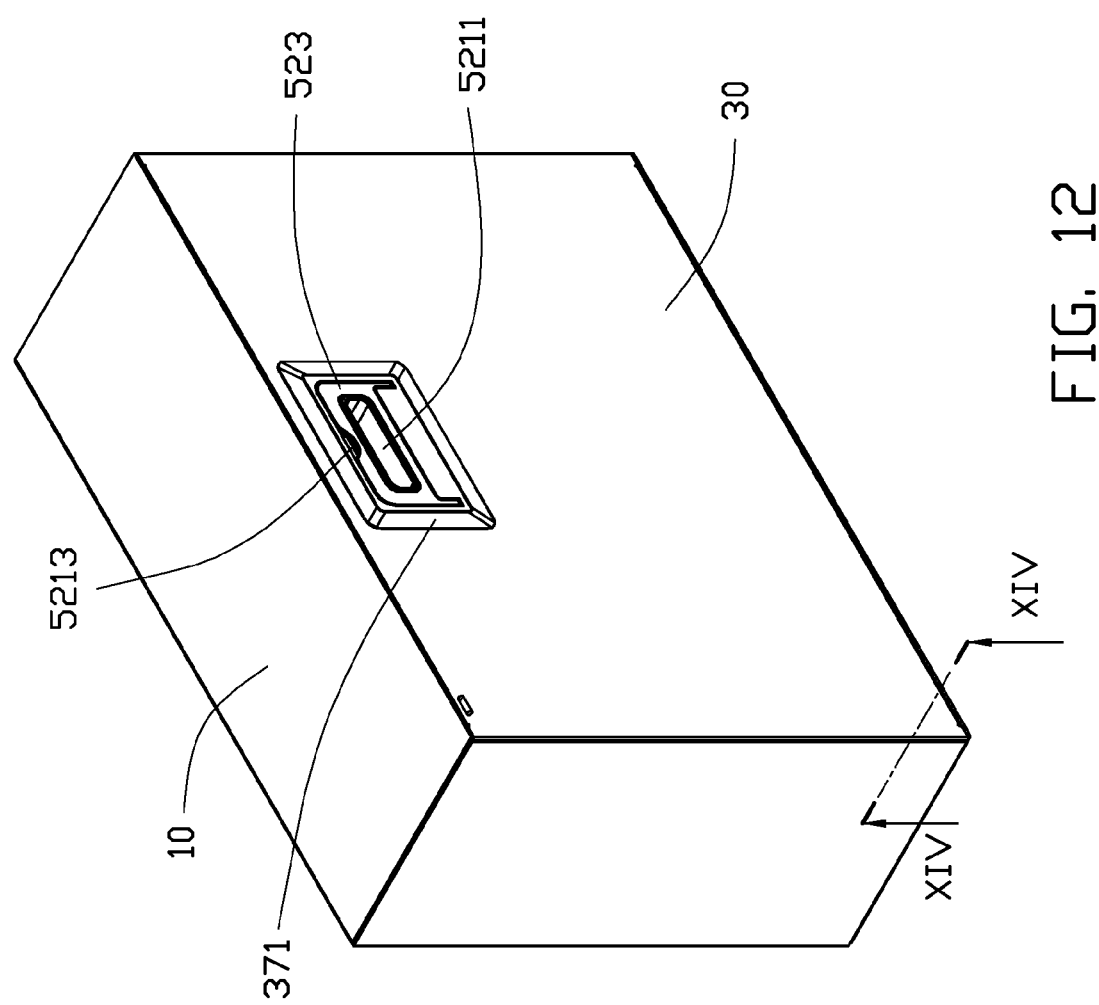
FIG. 12 is an assembled, isometric view of the enclosure of FIG. 1.

Referring to FIG. 7, each of the second latch mechanisms 55 includes a mounting bar 551, an actuating bar 553, a positioning pole 556, three locking members 558, and three second resilient members 559. The mounting bar 551 includes a rectangular middle plate 5510, and a first wing plate 5512 and a second wing plate 5514 perpendicularly extending from opposite sides of the middle plate 5510. The middle plate 5510 defines a connecting slot 5513 arranged adjacent to the second wing plate 5514. Two L-shaped inserting pieces 5515 extend from the middle plate 5510 towards the second wing plate 5514 and are arranged adjacent to the first wing plate 5512. The actuating bar 553 is long and rectangular, with three cutouts 5531 defined in a first sidewall of the actuating bar 553 and arranged along a lengthwise direction of the actuating bar 553. Three driving bevels 5532 are formed on the actuating bar 553 to bound the corresponding cutouts 5531. Two sliding slots 5537 are defined in the first sidewall of the actuating bar 553, along the lengthwise direction of the actuating bar 553. A retaining slot 5539 is defined in a second sidewall of the actuating bar 553 adjoining the first sidewall of the actuating bar 553. Each of the locking members 558 defines a receiving space 5580, and two pivot holes 5581, aligned with each other, respectively defined in opposite end walls bounding the receiving space 5580. Each of the locking members 558 forms a locking tongue 5585 and an engagement portion 5583 at opposite sidewalls of the locking member 558, respectively. In one embodiment, the second resilient members 559 are torque springs.

Referring to FIGS. 2-11, in assembly, each of the second latch mechanisms 55 is mounted to a corresponding reinforcing bar 35 of the cover 30, described as follows. The second resilient members 559 of the second latch mechanism 55 are accommodated in the receiving spaces 5580 of the corresponding locking members 558, and aligned with the pivot holes 5581 of the corresponding locking members 558. The positioning pole 556 extends through the second resilient members 559 and the locking members 558. The positioning pole 556 is received in the receiving space 351 bounded by the reinforcing bar 35, with the locking tongues 5585 of the locking members 558 aligned with the corresponding positioning holes 353 of the reinforcing bar 35. Opposite ends of each of the second resilient members 559 respectively resist against the corresponding locking member 558 and the cover 30. Opposite ends of the positioning pole 556 are respectively retained to the top flange 31 and the bottom flange 33 of the cover 30.

The actuating bar 553 is coupled to the mounting bar 551, with the inserting pieces 5515 of the mounting bar 551 slidably engaged in the corresponding sliding slots 5537 of the actuating bar 553, and the connecting slot 5513 of the mounting bar 551 aligned with the retaining slot 5539 of the actuating bar 553. The combined assembly of the mounting bar 551 and the actuating bar 553 is engaged with the reinforcing bar 35, with the first wing plate 5512 of the mounting bar 551 secured to the second piece 355 of the reinforcing bar 35 by screws, and the actuating bar 553 received in the receiving space 351 which is bound by the reinforcing bar 35. The driving bevels 5532 of the actuating bar 553 are aligned with the corresponding locking members 558.

The driving member 521 of the driving mechanism 52 is received in the accommodating space 511 of the bracket 51, with the coupling pieces 5218 of the driving member 521 extending through the corresponding through holes 5123 of the bracket 51, and the tab portions 5214 of the driving member 521 are slidably engaged in the corresponding guiding slots 5141 of the bracket 51. The spring piece 5121 of the bracket 51 is compressed by the driving member 521. The manipulating member 523 is attached to the driving member 521, with the positioning posts 5234 of the manipulating member 523 movably engaged in the corresponding oblong holes 5216 of the driving member 521. The pivoting posts 5233 of the manipulating member 523 are pivotally engaged in the corresponding pivot holes 5143 of the bracket 51.

The bracket 51 is attached to an inner surface of the cover 30, with the driving member 521 aligned with the opening 37 of the cover 30. The first fixing portion 516 of the bracket 51 is screwed to the fixing piece 36 of the cover 30. Each of the second fixing portions 5181 are fixed to the first wing plate 5512 of the mounting bar 551 of a corresponding second latch mechanism 55. The first resilient members 533 of the two first latch mechanisms 53 are placed around the inserting poles 5317 of the corresponding latching members 531. The sliding bars 5311 of the latching members 531 are received in the mounting slots 5171 of the corresponding first supporting arms 517 of the bracket 51. The inserting poles 5317 extend away from each other. Opposite ends of the first resilient members 533 respectively resist against a corresponding sliding bar 5311 and the first piece 354 of the corresponding reinforcing bar 35.

Distal ends of the first linking poles 541 of the drive links 54 extend through the corresponding alignment slots 5183 of the bracket 51 and the corresponding connecting slots 5513 of the mounting bars 551, to be retained in the corresponding retaining slots 5539 of the actuating bars 553. Two pins (not shown) correspondingly extend through the pivot holes 546 of the drive first linking poles 541, and are retained in the corresponding mounting holes 5185 of the bracket 51. The coupling portions 548 of the second linking pole 543 are securely connected to the corresponding coupling pieces 5218 of the driving member 521. Therefore, the drive links 54 are pivotably attached to the bracket 51, and connected to the driving member 521 and the corresponding second latch mechanism 55.

Referring to FIGS. 8-13, before assembling the cover 30 to the chassis 10, the manipulating member 523 is pivoted through the opening 37 of the cover 30, to an open position, where the bulges 5235 of the manipulating member 523 are engaged in the corresponding first positioning holes 5144 of the bracket 51. The ear portions 5214 of the driving member 521 abut against the corresponding abutting portions 5315 of the corresponding latching members 531, to urge the latching members 531 to unlocked positions. The first resilient members 533 are deformed. Correspondingly, the second resilient members 559 urge the corresponding locking members 558 to rotate to the unlocked positions, where the locking tongues 5585 are retracted to the corresponding receiving spaces 351 bounded by the reinforcing bars 35 of the cover 30.

In assembling the cover 30 to the chassis 10, which shields the opening 11 of the chassis 10, the plurality of tabs 14 of the chassis 10 extends through the corresponding through holes 331 of the cover 30, the plurality of latches 5313 of the latching members 531 extend through the corresponding latch holes 131 of the chassis 10, and the inner surface of the cover 30 abuts against the outside surfaces of the curling portions 16 of the chassis 10. The manipulating member 523 is pivoted towards the chassis 10 to a closed position, where the manipulating member 523 abuts against the driving member 521, and the bulges 5235 of the manipulating member 523 engage in the corresponding second positioning holes 5145 below the corresponding first positioning holes 5144 of the bracket 51.

With the pivoting of the manipulating member 523 towards the closed position, the driving member 521 is urged downwards by the positioning posts 5234 to compress the spring piece 5121, and subsequently, the first resilient members 533 urge the corresponding latching members 531 to slide towards the driving member 521, to make the ear portions 5214 of the driving member 521 keep abutment against and slide along the corresponding abutting portions 5315 of the latching members 531. When the latching members 531 arrive at locking positions, the plurality of latches 5313 abuts against sidewalls bounding the corresponding latch holes 131 of the chassis 10, to make the engagement teeth 5314 of the latches 5313 engage with the flange 13 of the chassis 10. At the same time, the downward movement of the driving member 521 makes the drive links 54 pivot to lever the corresponding actuating bars 553 to a locking position. Therefore, the driving bevels 5532 of the actuating bars 553 abut against the engagement portions 5583 of the corresponding locking members 558, and pivot the locking members 558 to overcome the rebounding force of the corresponding second resilient members 559 to locking positions, where the locking tongues 5585 engage with inner surfaces of the curling portions 16 of the chassis 10 opposite to the cover 30. Accordingly, the cover 30 is latched to the chassis 10, with engagement between the top edge of chassis 10 and the first latch mechanisms 53, and engagement between the side edges of the chassis 10 and the second latch mechanisms 55.

Figure 14:
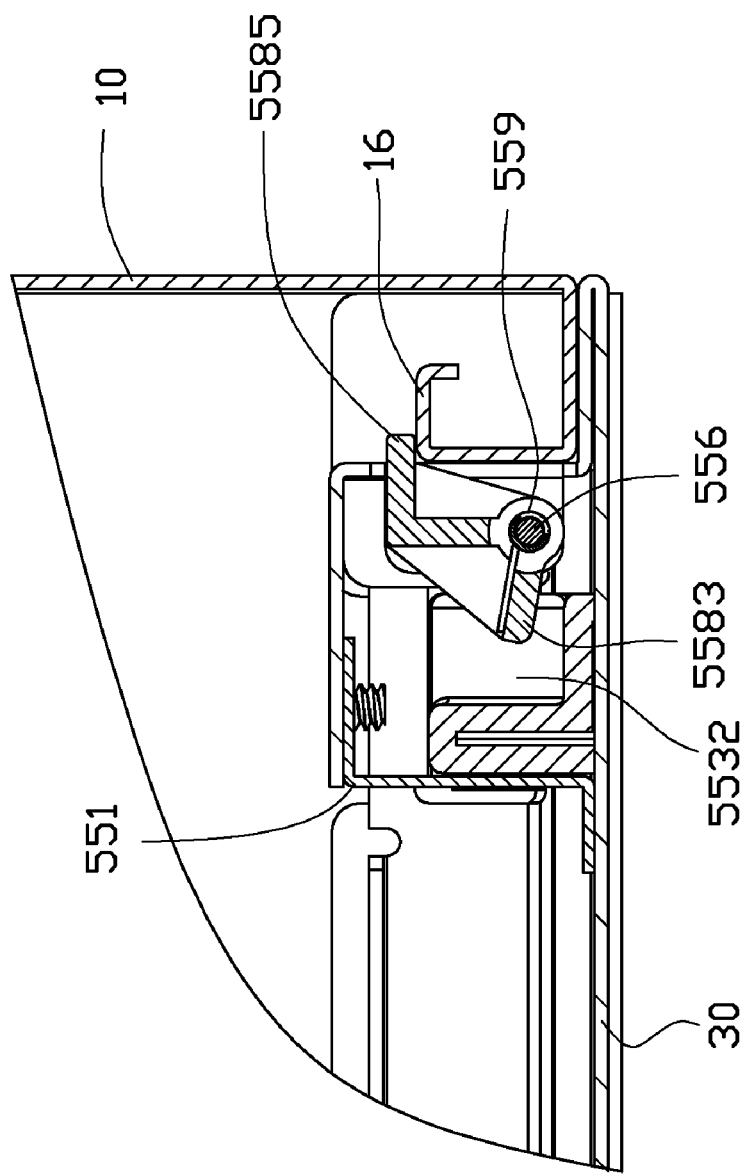
FIGS. 14 and 15 are cross-sectional views in an enlarged scale taken along the line XIV-XIV of FIG. 12, respectively showing the second latch mechanisms in the locked position and the unlocked position.

Referring to FIG. 14, when the manipulating member 523 is in the closed position, the opening 5236 and the notch 5230 of the manipulating member 523 are correspondingly aligned with the first recessed portion 5211 and the second recessed portion 5213 of the driving member 521. Therefore, it is convenient to extend fingers into the first recessed portion 5211 of the driving member 521 to pick up the enclosure, or extend a finger through the notch 5230 to operate the driving member 523.

Figure 15:
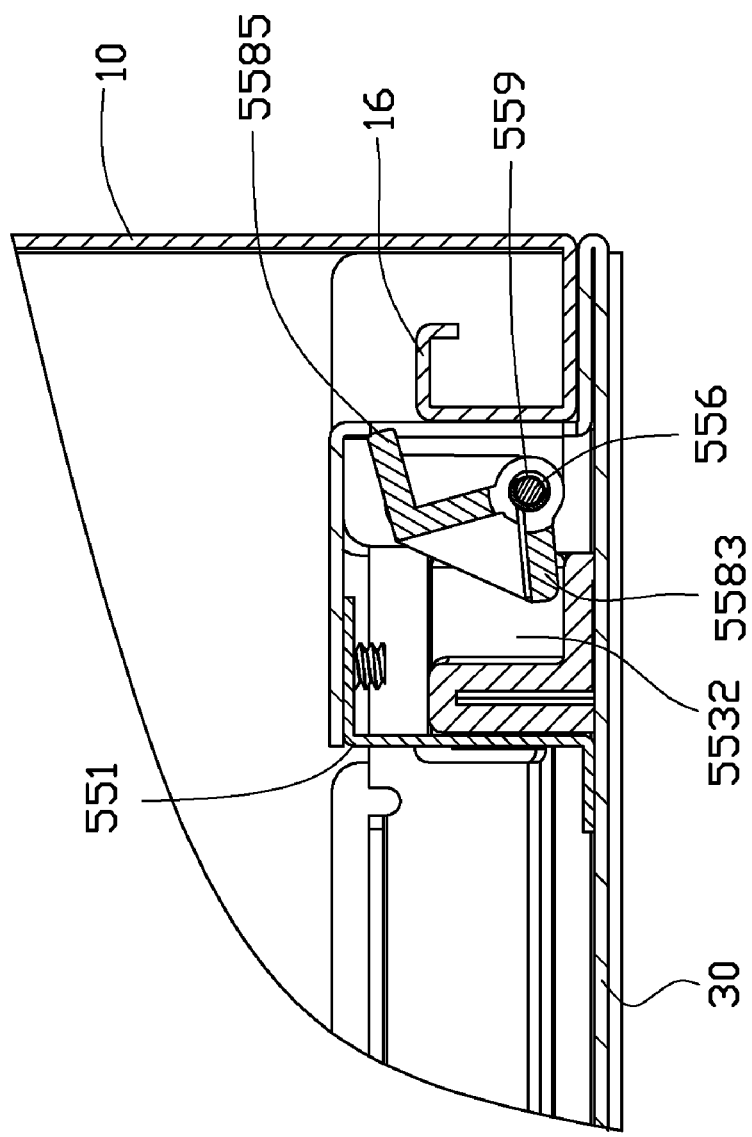

Referring to FIG. 15, to detach the cover 30 from the chassis 10, the manipulating member 523 is pivoted about the pivoting posts 5233 towards the open position, to make the bulges 5235 disengage from the corresponding second positioning holes 5145 and slide upwards. The spring piece 5121 rebounds to urge the driving member 521 upwards. The positioning posts 5234 of the manipulating member 523 move upwards with the driving member 521 to make the manipulating member 523 pivot on to the open position, where the bulges 5235 of the manipulating member 523 engage in the corresponding first positioning holes 5144 of the bracket 51. With the pivoting of the manipulating member 523 and the upwards movement of the driving member 521, the ear portions 5214 of the driving member 521 slide along the corresponding abutting portions 5315 of the latching members 531 to push the latching members 531 to slide away from the driving member 521 to the unlock positions, where the engagement teeth 5314 of the latches 5313 of the latching members 531 are aligned with the corresponding latch holes 131 of the flange 13 of the chassis 10. At the same time, the drive links 54 are pivoted to make the distal ends of the first linking poles 541 of the drive links 54 move downwards to cause downwards movements of the corresponding actuating bars 553. Therefore, the driving bevels 5532 of the actuating bars 553 disengage from the corresponding locking members 558. The second resilient members 559 rebound to urge the corresponding locking members 558 to rotate to the unlock positions, where the locking tongues 5585 disengage from the curling portions 16 of the chassis 10. Accordingly, the cover 30 is ready for being detached from the chassis 10.

It is believed that the present embodiments and their advantages will be understood from the foregoing description, and it will be apparent that various changes may be made thereto without departing from the spirit and scope of the description or sacrificing all of its material advantages, the examples hereinbefore described merely being exemplary embodiments.

What is claimed is:

1. An enclosure for an electronic device, comprising:
   a chassis defining an opening in a side;
   a cover attached to the chassis to shield the opening of the chassis; and
   a latch apparatus mounted to the cover, and comprising:
   two first latch mechanisms;
   two second latch mechanisms; and
   a driving mechanism connected to the first latch mechanisms and the second mechanisms;
   wherein the latch apparatus further comprises a bracket fixed to the cover, the driving mechanism comprises a driving member slidably mounted to the bracket, and a manipulating member connected to the bracket and the driving member, and pivotable between a close position, where the first latch mechanisms and the second latch mechanisms are driven to correspondingly securely engage with a first edge and two opposite second edges of the chassis adjoining the first edge at the opening, and an open position, where the first latch mechanisms and the second latch mechanisms are disengaged from the chassis, the pivoting movement of the manipulating member causes a sliding movement of the driving member;

wherein each of the second latch mechanisms comprises a plurality of locking members rotatable mounted to the cover, a plurality of first resilient members disposed between the cover and the corresponding locking members, and an actuating bar slidably mounted to the cover, the latch apparatus further comprises two drive links connecting the driving member and the corresponding actuating bars, the plurality of first resilient members urges the corresponding locking members to unlock positions in response to the manipulating member being pivoted to the open position, the driving member operates the actuating bars by the corresponding drive links to urge the locking members to lock positions overcoming rebounding force of the corresponding first resilient members in response to the manipulating member being pivoted to the closed position.

2. The enclosure of claim 1, wherein each of the first latch mechanisms comprises a latching member slidably mounted to the cover, and a second resilient member resisted between the latching member and the cover, wherein the second resilient members of the two first latch mechanisms urge the corresponding latching members to lock positions in response to the manipulating member being pivoted to the closed position, wherein the driving member urges the latching members to unlocking positions overcoming rebounding force of the corresponding second resilient members in response to the manipulating member being pivoted to the open position.

3. The enclosure of claim 2, wherein each of the latching members comprises a sliding bar slidably mounted to the bracket, and an abutting portion extending from the sliding bar along a slanting direction relative to a sliding direction of the sliding bar, the driving member comprises two ear portions abutting against the corresponding abutting portions of the latching members.

4. The enclosure of claim 3, wherein the chassis defines a plurality of latch holes, arranged adjacent to the first edge of the chassis, each of the latching members further comprises a plurality of latches extending from the sliding bar through the corresponding latch holes, the plurality of latches is prevented from being drawn out of the corresponding latch holes in response to the latching members sliding to the lock positions, the plurality of latches is enable to be drawn out of the corresponding latch holes in response to the latches members sliding to the unlock positions.

5. The enclosure of claim 1, wherein each of the second latch mechanisms further comprises a positioning pole retained to the cover, and extending through the plurality of locking members.

6. The enclosure of claim 1, wherein the chassis comprises two curling portions, respectively arranged adjacent to the opposite second edges of the chassis, each of the plurality of locking members comprises a locking tongue selectively abutting against one of the curling portions to prevent the detachment of the cover from the chassis in response to the locking member rotating to the lock position, or disengaging from the curling portions in response to the locking member rotating to the unlock position.

7. The enclosure of claim 1, wherein each of the plurality of locking members comprises an abutment portion, each of the actuating bars comprises a plurality of driving bevels to abut against the abutment portions of the plurality of locking members.

8. A latch apparatus to latch a cover to a chassis, the latch apparatus comprising:
a first latch mechanism comprising a latching member movably mounted to the cover between a lock position and an unlock position, thereby operable to releasably engage with a first edge of the chassis;
a second latch mechanism comprising a plurality of locking members each moveably mounted to the cover between a lock position and an unlock position, thereby operable to releasably engage with a second edge of the chassis adjoining the first edge;
a driving mechanism connected to the first latch mechanism and the second mechanism;
a bracket fixed to the cover; and
a drive link pivotably mounted to the bracket, and connected to the driving mechanism and the second latch mechanism;
wherein the driving mechanism is manipulated to cause movements of the first latch mechanism and the second latch mechanism;
wherein the driving mechanism comprises a driving member slidably mounted to the bracket, and a manipulating member pivotably connected to the bracket and the driving member, the driving member defines two oblong holes in opposite sides, the manipulating comprises two pivoting posts pivotably engaged with the bracket, and two positioning posts adjacent to the corresponding pivoting posts to be movably received in the corresponding oblong holes; and
wherein the second latch mechanism further comprises a plurality of first resilient members disposed between the cover and the plurality of the locking members, to urge the plurality of locking members towards the unlock position, and the driving mechanism operates the plurality of looking members by the drive link to rotate towards the lock position overcoming the rebounding force of the plurality of first resilient members.

9. The latch apparatus of claim 8, wherein the first latch mechanism further comprises a second resilient member resisting against the latching member and the cover, to urge the latching member towards the lock position, and the driving member abuts against the latching member to operate the latching member to slide towards the unlock position overcoming the rebounding force of the second resilient member.

10. The latch apparatus of claim 9, wherein the latching member comprises a plurality of latches to correspondingly extend through a plurality of latch holes of the chassis adjacent to the first edge, in response to the locking position of the latching member.

11. The latch apparatus of claim 9, wherein each of the plurality of locking members of the second latch mechanism comprises a locking tongue to abut against a curling portion of the chassis adjacent to the second edge, in response to the locking position of the plurality of locking members.

12. The latch apparatus of claim 8, wherein the second latch mechanism further comprises an actuating bar slidably mounted to the cover, the driving member of the driving mechanism and the actuating bar of the second latch mechanism are fixed to opposite ends of the driving link, the actuating bar forms a plurality of driving bevels correspondingly aligned with the plurality of locking members, and the actuating bar slides to make the plurality of driving bevels to move to or away from the plurality of locking members in response to the sliding of the drive member.

13. An enclosure for an electronic device, comprising:
a chassis defining an opening in a side;

a cover attached to the chassis to shield the opening of the chassis; and a latch apparatus mounted to the cover, and comprising:

two first latch mechanisms;

two second latch mechanisms; and a driving mechanism connected to the first latch mechanisms and the second mechanisms;

wherein the latch apparatus further comprises a bracket fixed to the cover, the driving mechanism comprises a driving member slidably mounted to the bracket, and a manipulating member connected to the bracket and the driving member, and pivotable between a close position, where the first latch mechanisms and the second latch mechanisms are driven to correspondingly securely engage with a first edge and two opposite second edges of the chassis adjoining the first edge at the opening, and an open position, where the first latch mechanisms and the second latch mechanisms are disengaged from the chassis, the pivoting movement of the manipulating member causes a sliding movement of the driving member;

wherein each of the first latch mechanisms comprises a latching member slidably mounted to the cover, and a first resilient member resisted between the latching member and the cover, wherein the first resilient members of the two first latch mechanisms urge the corresponding latching members to lock positions in response to the manipulating member being pivoted to the closed position, wherein the driving member urges the latching members to unlocking positions overcoming rebounding force of the corresponding first resilient members in response to the manipulating member being pivoted to the open position;

wherein each of the latching members comprises a sliding bar slidably mounted to the bracket, and an abutting portion extending from the sliding bar along a slanting direction relative to a sliding direction of the sliding bar, the driving member comprises two ear portions abutting against the corresponding abutting portions of the latching members.

\* \* \* \* \*